United States Patent [19]

Partin

[11] Patent Number: 4,608,694
[45] Date of Patent: Aug. 26, 1986

[54] LEAD-EUROPIUM SELENIDE-TELLURIDE HETEROJUNCTION SEMICONDUCTOR LASER

[75] Inventor: Dale L. Partin, Sterling Heights, Mich.

[73] Assignee: General Motors Corporation, Detroit, Mich.

[21] Appl. No.: 565,397

[22] Filed: Dec. 27, 1983

[51] Int. Cl.$^4$ ........................ H01S 3/19; H01L 33/00
[52] U.S. Cl. ..................................... 372/44; 357/16; 357/17; 357/61; 372/45
[58] Field of Search ................... 372/44, 45; 357/16, 357/17, 61

[56] References Cited

U.S. PATENT DOCUMENTS

| | | | |
|---|---|---|---|
| 2,978,661 | 4/1961 | Miller et al. | 338/22 |
| 3,311,510 | 3/1967 | Mandelkorn | 148/1.5 |
| 3,353,907 | 11/1967 | Schafer | 123/150 |
| 3,370,342 | 2/1968 | Argyle et al. | 29/472.7 |
| 3,370,942 | 2/1968 | Inoue | 75/134 |
| 3,371,041 | 2/1968 | Holtzberg et al. | 252/62.51 |
| 3,371,042 | 2/1968 | McGuire et al. | 252/62.51 |
| 3,403,133 | 9/1968 | Frederick et al. | 252/62.3 |
| 3,409,554 | 11/1968 | Mandelkorn | 252/62.3 |
| 3,418,036 | 12/1968 | Holtzberg et al. | 350/151 |
| 3,544,865 | 12/1970 | Holtzberg et al. | 317/237 |
| 3,574,676 | 4/1971 | Gambino et al. | 117/201 |
| 3,716,424 | 2/1973 | Schoolar | 148/1175 |
| 3,818,328 | 6/1974 | Zinn | 324/43 R |
| 4,350,990 | 9/1982 | Lo | 357/16 |

OTHER PUBLICATIONS

Weber et al., "Waveguide and Luminescent Properties of Thin Film Pb-Salt Injection Lasers", J. Appl. Phys. vol. 44, No. 11, Nov. 1973, pp. 4991-5000.
Antcliffe et al., "Characteristics of Tunable $Pb_{1-x}Sn_xTe$ Junction Lasers in the 8-12 μm Region", J. Appl. Phys., vol. 44, No. 9, Sep. 1973, pp. 4145-4160.
E. Kaldis and W. Peteler, Iswestia po-Chimia, Bulgaria Academy of Sciences, 11, No. 3/4, 431 (1978).
R. Suryanarayanan and C. Paparoditis, J. De. Physique 29, Coll. C4, 11-12, p. C-4-46 (1968).
C. Paparoditis and R. Suryanarayanan, J. Cryst, Growth 13/14, 389 (1972).
R. Suryanarayanan and C. Paparoditis, Les Elements des Terres Rares, Colloq. Intern. C.N.R.S., Grenoble, No. 180, p. 149, (1969).
S. Rotter, D. Kasemset, and C. G. Fonstad, IEE Electron Device Letters, EDL-3, 66 (1982).
D. Kasemset, S. Rotter, and C. G. Fonstad, J. Electronic Materials 10. 863 (1981).
D. Kasemset and C. G. Fonstad, Appl. Phys. Letters, 39(11), 872 (1981).

Primary Examiner—James W. Davie
Assistant Examiner—Georgia Y. Epps
Attorney, Agent, or Firm—Robert J. Wallace

[57] ABSTRACT

A double heterojunction lead salt diode infrared laser having an active region layer of a lead salt semiconductor of a given lattice constant, energy band gap, and index of refraction. The active region layer is sandwiched between two lead salt semiconductor layers containing europium and selenium that are mutually of opposite conductivity type and have substantially the same lattice constant as the active region layer. In addition, the europium and selenium-containing lead chalcogenide layers have an energy band gap greater than the active region layer and an index of refraction less than the active region layer. Hence, the laser has lattice matching, as well as enhanced carrier confinement and optical confinement.

6 Claims, 2 Drawing Figures

LEAD-EUROPIUM SELENIDE-TELLURIDE HETEROJUNCTION SEMICONDUCTOR LASER

FIELD OF THE INVENTION

This invention relates to improved double heterojunction lead salt semiconductor diode infrared lasers. It more particularly involves long wavelength infrared lasers having a lead chalcogenide active layer sandwiched between two lead chalcogenide layers that contain europium and selenium and that are lattice matched and of higher band gap energy.

BACKGROUND OF THE INVENTION

A semiconductor diode laser is a monocrystalline pn junction device. In one form of such a device, the pn junction is in a plane disposed in an active region between two parallel rectangular faces of a monocrystalline semiconductor body. Two mutually parallel reflective faces that are perpendicular to the pn junction form a laser cavity. Lasing action is produced by applying a forward voltage across the pn junction. The forward bias injects electrons and holes across the pn junction. Electrons and holes recombine in the active region to cause stimulated emission of the radiation. Above a given level of electron injection, called the threshold current ($I_{TH}$), emitted radiation is collected and amplified in the active region. The amplified radiation exits the active region parallel the pn junction as a monochromatic beam.

A problem is that electrons and holes can be injected into the active region without stimulating emission therein. For example, they can escape outside the active region to adjacent portions of the semiconductor body, where they recombine without contributing to laser emission. Analogously, photons produced in the active region can escape from the active region by radiation in a direction not parallel the pn junction. In addition, it is possible for electrons to disappear within the active region without producing the desired emission of radiation, such as by combining with holes at crystal defects All such losses reduce laser efficiency, i.e. output power. One can restrict escape of injected electrons and holes and stimulated photons from the active region by sandwiching the active region between two contiguous layers of monocrystalline semiconductive material having a larger energy band gap and a lower index of refraction than the active region. Such layers serve to confine electrons, holes and photons to the active region. On the other hand, the active region, and as a practical matter the two contiguous layers must be of a very high monocrystalline quality. This requires that these layers and the active region be closely matched not only in crystal structure but also in crystal lattice size. Moreover, one of the sandwiching layers must be doped to n-type conductivity and the other to p-type conductivity. Such a structure is referred to herein as a double heterojunction semiconductor diode laser.

Highly efficient lead chalcogenide double heterojunction short wavelength semiconductor lasers have heretofore been difficult to make. By short wavelength I mean shorter than about 5 micrometers. I have found a material which permits one to make such a short wavelength laser easily. However, in addition, the concepts of this invention can even be used to make longer wavelength diode lasers, should it be desired.

OBJECTS AND SUMMARY OF THE INVENTION

It is therefore a principal object of this invention to provide an improved short wavelength lead salt semiconductor diode laser.

Another object of the invention is to provide an improved lead-europium chalcogenide salt heterojunction diode infrared laser.

Still another object of the invention is to provide a short wavelength heterojunction diode laser having a lead-europium selenide-telluride active region and lead-europium selenide-telluride confining regions.

The invention comprehends a short wavelength infrared double heterojunction lead salt diode laser having a lead-europium selenide-telluride or lead-tin telluride active region layer. The active region layer is sandwiched between an upper n-type confinement layer and a lower p-type buffer layer, both of which are lattice-matched lead-europium selenide-telluride layers. The buffer layer is also a confinement layer, as is usual in a double heterojunction diode laser structure. The lead-europium selenide-telluride confinement and buffer layers have a larger concentration of europium and selenium than the active region layer and, therefore, have a larger energy band gap and a lower index of refraction. However, both the confinement layer and the buffer layer have an identical crystal structure to that of the active region layer and substantially the same lattice constant. In a preferred example, all three layers are epitaxially grown on a high quality lead telluride substrate and are of substantially the same lattice constant. They are covered with an epitaxially deposited contact layer of lead telluride, which is of the same lattice constant. In using this invention to make a long wavelength embodiment, the substrate, active region layer, and contact layer are of lead-tin telluride lattice-matched to the confinement and buffer layers.

Figure 1:
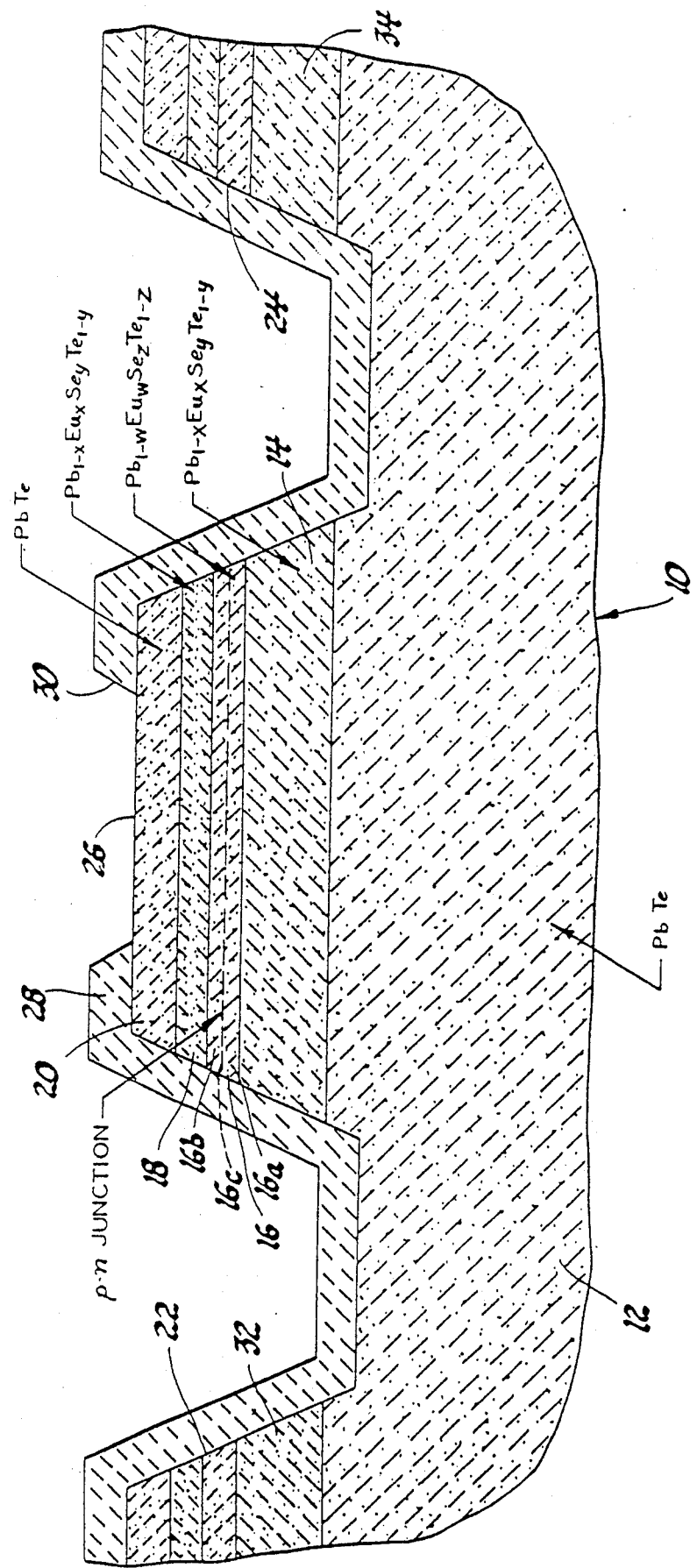
FIG. 1 is a cross section of the first embodiment of the double heterojunction semiconductor lead salt laser of the invention.

DESCRIPTION OF THE PREFERRED EMBODIMENTS:

In substance, this invention recognizes that the inclusion of small amounts of europium in a lead or lead-tin telluride composition can significantly increase the energy band gap and decrease the index of refraction. This invention also recognizes that small amounts of europium increase the crystal lattice constant However, this invention further recognizes that the crystal lattice constant can be reduced by including selenium in the composition, along with the europium, but that the selenium does not significantly reduce band gap or increase index of refraction, Moreover, this invention recognizes that even though appreciable proportions of lead and/or tin are replaced by europium, and tellurium by selenium, the resultant semiconductor can still be heavily doped to both n-type and p-type conductivity. In addition, abrupt heterojunctions can be made because europium and selenium have low diffusion constants in lead telluride. These attributes are very important to a double heterojunction lead salt diode infrared laser such as shown in the drawing.

The frist Figure of the drawing illustrates a semiconductor diode laser element 10 made on a 0.5 millimeter thick monocrystalline lead telluride (PbTe) substrate 12. Substrate 12 has a p-type doping of about $2 \times 10^{19}$ atoms per cubic centimeter. As is normal for such compositions, the crystal structure is face centered cubic and the lattice constant is about 6.460 angstroms. The drawing shows a fragment of substrate 12 in section across mesas on its surface. The fragment shown includes an entire mesa in a central portion and portions mesas 32 and 34 on each side of the central mesa. The central mesa contains a laser cavity, and is as hereinafter described. As is usual, side mesas 32 and 34 are only present because they are incidentally formed in the laser element manufacturing process. Thus, they are no more important to this invention than they are to any other semiconductor diode laser structure.

The structure in the drawing is made by epitaxially depositing a blanket semiconductive layer 14 of $Pb_{0.980}Eu_{0.020}Se_{0.023}Te_{0.977}$ onto the lead telluride substrate 12. It can be seen that semiconductive lead salt layer 14 differs from the lead salt substrate 12 in that it also contains both europium and selenium. Even though semiconductive layer 14 contains 2.0 mole percent europium and 2.3 mole percent selenium, it still is monocrystalline and has a face centered cubic crystal structure with a lattice constant of about 6.460 angstroms. In addition, it is of p-type conductivity, having a heavy p-type dopant concentration of approximately $1 \times 10^{19}$ atoms per cubic centimeter. Thus, the interface between layers 14 and substrate 12 presents no significant electrical resistance. The europium and selenium-containing lead chalcogenide layer 14 is most importantly an electron, hole and photon confinement layer for the active layer 16 that is over it. As such, it should be at least about 1-2 micrometers thick. However, layer 14 also serves as a buffer layer for layer 16. To serve the latter purpose as well, layer 14 is grown to a thickness of about 5 microns. By buffer layer I mean that layer 14 is grown to a sufficient thickness to at least partially mask crystal imperfections that may arise at its interface with the substrate 12. Such a thickness and purpose is not new, nor more critical to this invention than any other lead salt laser. In any event, a thickness of at least about 3 microns is generally needed to perform the buffering function. Generally, there is not much improvement in the buffering function with thicknesses above 6 microns.

A blanket epitaxial layer 16 of $Pb_{0.9985}Eu_{0.0015}Se_{0.002}Te_{0.998}$ semiconductive material is then grown on top of the europium and selenium-containing semiconductive layer 14. It is monocrystalline and of face centered cubic crystal structure, having a lattice constant of about 6.460 angstroms. The europium concentration of layer 16 is about 2 mole percent less than the europium concentration of the buffer layer 14 and the semiconductive confinement layer 18 that is disposed on semiconductive active layer 16. This change in concentration produces a change in energy band gap and index of refraction hereinbefore referred to. The europium concentration of the buffer layer 14 and of the confinement layer 18 must be greater than that of the active layer 16 by at least about 1 mole percent, but may be greater than that of the active layer 16 by up to about 4 mole percent. Higher differences may be used but produce no significant additional benefits. Further, compositions with greater than about 15 mole percent europium may, however, be difficult to dope heavily n-type and/or p-type. Hence, I prefer to use only small or no europium proportions in the active layer 16. This concurrently makes lattice matching easier.

The energy, E, in millielectron volts of photons emitted from lasers with $Pb_{1-x}Eu_xSe_yTe_{1-y}$ active layers is given by $$E = A + \frac{BT^2(1-Cx)}{T+D} + Ex$$

where A=185 meV, B=0.548 meV/K$^{-2}$, C=11.0, D=30 K, E=5800 meV, T is the temperature in degrees Kelvin, x is the europium mole fraction, and y (the selenium mole fraction) is given by the condition for lattice matching $Pb_{1-x}Eu_xSe_yTe$ to PbTe which is discussed below. This formula has so far been verified for $0 \leq x \leq 0.046$. I believe that larger values of x will probably also be useful in laser active regions, but the limits have not yet been well established.

The lower portion 16a of semiconductive layer 16 is doped to p-type conductivity, having a p-type impurity concentration of about $1 \times 10^{17}$ to $2 \times 10^{18}$ atoms per cubic centimeter. The upper portion 16b of layer 16 is doped to n-type conductivity, having an n-type impurity concentration of about $1 \times 10^{17}$ to $2 \times 10^{18}$ atoms per cubic centimeter. The interface between the n-type layer upper portion 16b and the p-type layer lower portion 16a forms a pn junction 16c. Layer 16 thus comprises the laser active region. For ease of identification of this layer as compared to the other layers, I refer to this entire layer 16 as the active region layer.

A blanket epitaxial layer 18 of n-type $Pb_{0.980}Eu_{0.020}Se_{0.023}Te_{0.977}$ is disposed on the upper surface of the active layer 16. As previously mentioned, this layer is a second, or upper, europium and selenium-containing semiconductive lead chalcogenide layer 18 that is similar in composition and properties to the lower lead chalcogenide semiconductive layer 14, except for a difference in doping. The upper europium and selenium-containing lead chalcogenide semiconductor layer 18 is heavily doped to n-type conductivity by containing an n-type impurity concentration of about $2 \times 10^{18}$ to $1 \times 10^{19}$ atoms per cubic centimeter. Like the lower europium and selenium-containing lead chalcogenide semiconductor layer 14, the upper europium and selenium-containing lead chalcogenide semiconductor layer 18 has a face centered cubic crystal lattice having a lattice constant of about 6.460 angstroms. Both of layers 14 and 18 have an energy band gap ($E_g$) that is higher and an index of refraction that is lower than that of the active region layer 16. Hence, they can provide both carrier and optical confinement.

The thickness of confinement layer 18 and active region layer 16, including its portions 16a and 16b, are the same in this invention as they would be in other semiconductor diode lasers. For example, I prefer that the active region layer 16 and the confinement layer 18 each be about 1-2 micrometers thick. As with any other heterojunction semiconductor diode lasers, layer 18 should have a thickness of at least about 0.1 micrometer in order to significantly confine electrons and holes. I doubt that there is much benefit in having the confinement layer 18 be appreciably thicker than about 3 micrometers. In fact, if it is too thick, it will impede heat flow away from the pn junction 16c. It should be remembered, of course, that lead salt semiconductors are not particularly heat conductive. In view of this, one ordinarily wishes to have junction 16c be as close to the upper surface 26 of the laser element 10 as is practical, because a heat sink (not shown) is affixed to that surface.

In addition, in order to insure that a durable, low resistance ohmic contact can be obtained on the upper surface of the device, a final upper semiconductive layer 20 is epitaxially deposited onto the confinement layer 18. The upper layer 20 is of lead telluride (PbTe). It is a semiconductive monocrystalline layer having the same face centered cubic crystal structure and lattice constant of 6.460 angstroms as the underlying layers. It is heavily doped to n-type conductivity, by having an n-type impurity concentration of about $1 \times 10^{19}$ atoms per cubic centimeter.

Layer 20 has a thickness of about 1-2 micrometers. If this layer 20 is to be used at all, i.e. to enhance contact formation, it should have a thickness at least large enough to provide a continuous coating. On the other hand, it should not be so thick as to provide a significant thermal resistance between the pn junction 16c and the upper surface 26 of the laser element, where heat is ordinarily withdrawn to cool the laser. Accordingly, I would not want the layer 20 to be appreciably more than about 2 micrometers thick.

Ordinarily, a laser such as shown in the drawing is fabricated by initially blanket depositing its various layers onto a substrate and then surface etching the resultant product to define the lasing mesa, i.e. the central mesa in the drawing. I contemplate making my laser similarly. For example, after layers 14, 16, 18 and 20 are epitaxially deposited, parallel grooves 22 and 24 are etched into the upper surfaces 26 of the wafer, preferably down through all of the layers and into the surface of the substrate 12. The length, width and depth of the grooves, as well as their side wall angle with surface 26, are no more material to this invention than they are to any other double heterojunction semiconductor infrared diode laser. For purposes of providing a specific example, they should be wide enough apart to provide a width on upper surface 26 of the central mesa of about 5-40 micrometers, preferably 20 micrometers. The length of upper surface 26 should be about 150-600 micrometers, preferably 400 micrometers. The width of grooves 22 and 24 is not especially critical either. Then the entire upper surface 26 is anodized, including the surfaces within the grooves 22 and 24, to form a native oxide coating 28.

A rectangular contact window 30, extending substantially along the entire length of the upper surface 26, is opened in anodic oxide coating 28 by photoetching techniques, so that a low resistance ohmic contact can be made along the entire upper surface 26 of the upper layer 20. The coated substrate is then cut along the side mesas 32 and 34 to provide an elongated body having a central mesa for lasing. The ends of the substrate 12 are then cleaved in the normal and accepted manner, to provide a laser cavity in the central mesa. Low resistance electrical contacts can be made to n-type surface 26, and to the p-type backside (not shown) of substrate 12 in any normal and accepted manner for making contacts to PbTe. For example, they can be made in the same manner previously described in Wayne Lo's U.S. Pat. No. 4,350,990, which is entitled "Electrode for Lead-Salt Diodes" and which is incorporated herein by reference.

Dopants used in the substrate 12 and the various layers 14, 16, 18 and 20 can be the same as those conventionally used in making any lead salt semiconductor diode laser. As for example, one can dope to n-type conductivity by using an excess of lead in the semiconductor composition or by including appropriate quantities of bismuth, copper or cadmium atoms in the layer. They can be included as grown, by ion implantation, or by diffusion. Analogously, p-type doping can be by an excess of tellurium or by including thallium, silver or sodium in the semiconductor composition. Normally, one would want to use a dopant that has a very low diffusion constant to insure that the pn junction 16c is not only abrupt as formed but remains so during use. Accordingly, in most instances, it is preferred to dope the various layers as formed rather than subsequently by diffusion. I prefer to use bismuth as the n-type dopant and thallium as the p-type dopant.

In general about 1-15, preferably less than 20, mole percent of europium and selenium should be included in layers 14 and 18 in substantially the same amounts in each layer, if one is to expect best results. A few mole percent, i.e. about 1-4 mole percent, less of europium in the active layer 16 produces a sufficient band gap and index of refraction difference with the buffer anode confinement layers 14 and 18. Accordingly, the active region layer 16 could contain from zero up to about 15 mole percent europium too. A correspondingly lesser proportion of selenium is used, of course, to preserve lattice matching. Further, additional proportions of europium and selenium can be used, and may even be needed such as for lattice matching if the active region and the confining layers are not otherwise the same.

I have found that the change in lattice constant from EuTe to PbTe, with increasing amounts of lead substituted for europium, is not as previously expected. I have found that it is best described as a parabola, not a straight line. On the other hand, substituting increasing amounts of selenium for tellurium in PbTe produces a generally straight line change in lattice constant. As mentioned before, europium increases the lattice constant and selenium decreases it. I have found that to get precise lattice matching they should be present according to the following relationship; where a=lattice constant, $\Delta a_1 = a_{PbEuTe} - a_{PbTe}$; $\Delta a_2 = a_{PbSeTe} - a_{PbTe}$; A=37.3, B=2.00, $K_y$=0.334, x equals the mole percent europium, and y equals the mole percent selenium in $Pb_{1-x}Eu_xSe_yTe_{1-y}$.

$$\Delta a_1 = [(B^2 + 4Ax)^{\frac{1}{2}} - B]/2A$$

$$\Delta a_2 = -K_y Y$$

When $\Delta a_1 + \Delta a_2 = 0$, the lattice constant of $Pb_{1-x}Eu_xSe_yTe_{1-y}$ is matched to that of PbTe.

In cases where operation of wavelengths greater than 5-6 microns is desired, a $Pb_{1-z}Sn_zTe$ active region may be used. In such instance, the substrate and covering layer would also be of $Pb_{1-z}Sn_zTe$. The buffer and confinement layers would then consist of $Pb_{1-x}Eu_x Se_yTe_{1-y}$. The lattice is given by $\Delta a_3 = a_{PbSnTe} - _{PbTe}$, with $K_z = 0.132$ and $\Delta a_3 = -K_z Z$.

The lattice matching condition between the active layer and the buffer and confinement layers is then given by $\Delta a_1 + \Delta a_2 = \Delta a_3$.

Alternatively, $(Pb_{1-z}Sn_z)_{1-y}Eu_xSe_yTe_{1-y}$ can be used for confinement and buffer layers with $Pb_{1-z}Sn_zTe$ active layers. In fact I prefer it, so that lesser proportions of europium and selenium need be used. In this case, the lattice-matching condition is given approximately by $\Delta a_1 + \Delta a_2 = 0$.

In either of these cases of a $Pb_{1-z}Sn_zTe$ active region, the substrate crystal would be $Pb_{1-w}Sn_wTe$ with $0 \leq w \leq z$. However, I prefer w to be equal to z as closely as possible so that the entire structure (substrate, buffer layer, active layer, confinement layer, and final contact layer 20) is lattice-matched. The useful range of z in either case is approximately 0–35 mole percent, with x and y each greater than about 1 mole percent.

As previously mentioned, this invention is primarily of interest in that it can be used to form a double heterojunction structure in combination with lead telluride to form the short, i.e. less than about 5 micrometers, wavelength infrared diode lasers. In the past, such laser structures had to be made using lead salt semiconductors such as lead cadmium sulfide, lead sulfide, lead sulfide selenide, lead cadmium telluride, lead manganese telluride, lead germanium telluride and the like. All of the latter materials present difficulties in fabricating lattice-matched double heterojunction lasers. However, even more importantly it is extremely difficult to make durable low resistance ohmic contacts to such semiconductors. Consequently, the diode lasers that have been fabricated with these materials have almost universally been limited to low CW operating temperatures. When using my invention in a double heterojunction structure such as hereinbefore described, I have been able to reproducibly obtain over 100 microwatt CW power output per facet of the laser cavity at temperatures well over 100 K, and even up to 147 K. I believe that these advancements in laser performance are obtained because of good carrier and photon confinement by my europium-containing lattice-matched confinement layers. However, in addition, it is to be noted that these confinement layers are sandwiched between lead telluride layers to which durable low resistance contacts can be readily made. Accordingly, this invention is most importantly applied to short wavelength infrared diode lasers, such as lasers having a lead-europium selenide-telluride active region.

On the other hand, it appears that this invention could be applied to longer wavelength lead salt diode lasers too, as for example lead-tin telluride lead salt diode lasers. In such instance, the active region of the laser would be described by the formula $Pb_{1-z}Sn_zTe$. The confinement layers would be formed with a composition having the following formula $(Pb_{1-z}Sn_z)_{1-x}Eu_xSe_yTe_{1-y}$. The europium and selenium content in the latter composition would be about as previously described. Tin concentration can vary from small but effective amounts up to about 35 mole percent. My invention is described in the recently filed U.S. patent application Ser. No. 543,368, U.S. Pat. No. 4,577,322 entitled "Lead-Ytterbium-Tin Telluride Heterojunction Semiconductor Laser". The latter approach to making long wavelength lead chalcogenide infrared lasers does not involve as much complexity in lattice matching as is involved in the present invention. Hence, it should be easier to make lasers in accordance with it. However, my studies of it are not complete. It may subsequently develop that the principles of the present invention are also of significant interest to any wavelength lasers. My studies of both are expected to continue.

Figure 2:
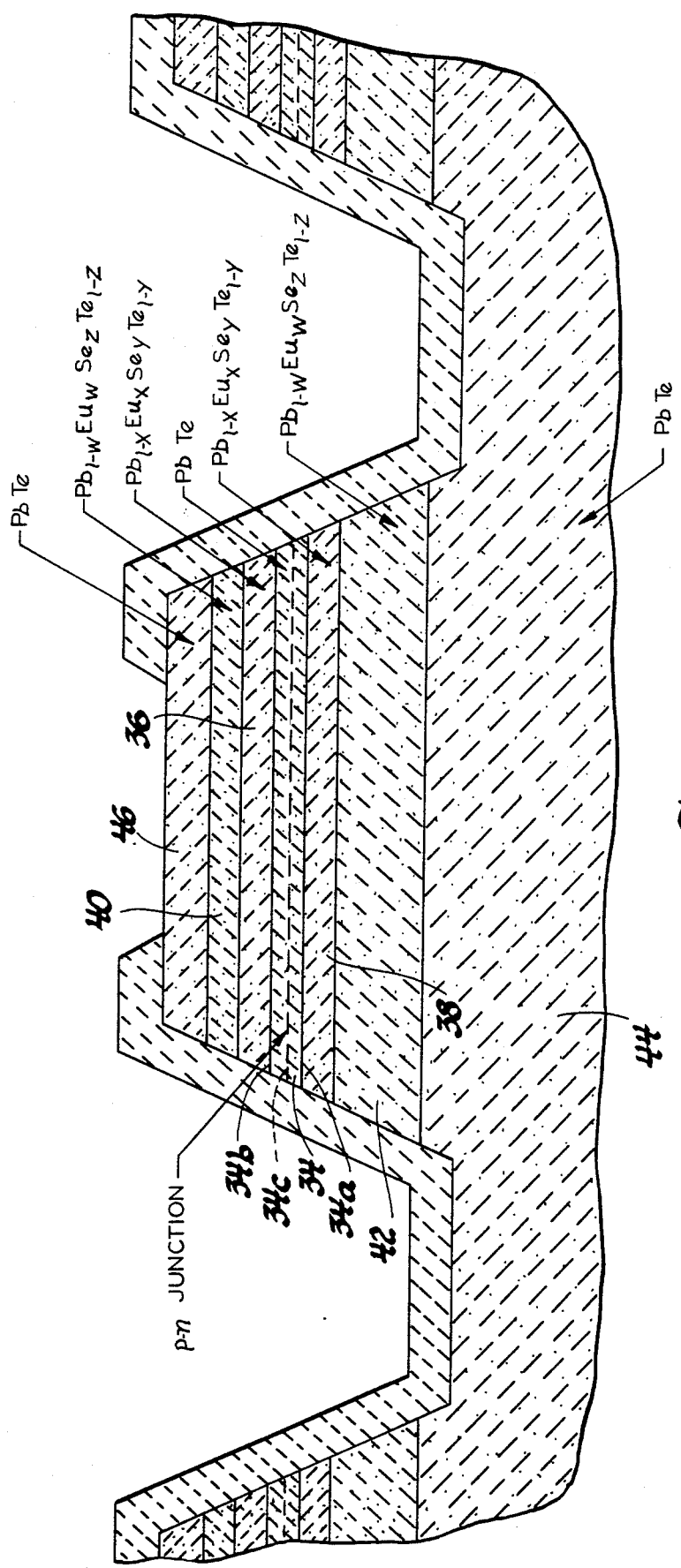
FIG. 2 is a cross section of the second embodiment of the double heterojunction semiconductor lead salt laser of the invention.

Of most recent significant interest to me is that I have been able to use this invention to form a large optical cavity single quantum well laser that exhibited continuous wave (CW) mode operation up to 172 K. Moreover, it operated up to 220 K in pulsed mode operation. This laser is represented by FIG. 2. It had a 600 angstrom thick active region 34 disposed within about a 3 micron wide optical cavity. Hence, the device is analogous to a large optical cavity multiple quantum well (LOCMQW) type of device. However, my device only had a single quantum well. In this laser, a 600 angstrom thick layer 34 of lead telluride forms the active region. A p-n junction 34c separated opposite faces 34a and 34b of this layer. The active region layer 34 was sandwiched between mutually opposite conductivity type $Pb_{1-x}Eu_xSe_yTe_{1-y}$ layers 36 and 38 lattice-matched to PbTe. They each contained about 2 mole percent europium and were about 1.5 micrometer thick. The interface of these layers with the active region layer defined the quantum well. These layers are referred to herein as carrier confinement layers. They were, in turn, sandwiched between about 1.5-2 micrometers thick mutually opposite conductivity type $Pb_{1-w}Eu_wSe_zTe_{1-z}$ layers 40 and 42 lattice-matched to PbTe. These latter two layers 40 and 42 contained about 4 mole percent europium and served to confine photons. The interface of these optical confinement layers with the carrier confinement layers defined an optical cavity. In the completed device the optical confinement layers were, in turn, sandwiched between a PbTe substrate 44 and a covering PbTe lsyer 46, of mutually opposite conductivity type. Thus, the structure is analogous to that shown in FIG. 1 of the drawing but contains still another pair of confinement layers, specifically for optical confinement. Improved results were also obtained with a quantum well only 300 angstroms wide.

The embodiment of the invention in which an exclusive property or privilege is claimed are defined as follows:

1. In a double heterojunction semiconductor lead salt infrared diode laser, the improvement wherein a semiconductive monocrystalline lead salt active region layer of given energy band gap, index of refraction, crystal structure and lattice constant is sandwiched between two semiconductive monocrystalline lead salt layers of mutually opposite conductivity type containing europium and selenium and having an energy band gap significantly higher than, an index of refraction significantly lower than, a crystal structure the same as, and a lattice constant substantially equal to said active region layer, effective to increase laser performance by providing lattice matching among said layers as well as providing at least carrier confinement with respect to said active region layer.

2. In a double heterojunction semiconductor infrared diode laser exhibiting current carrier and optical confinement for its active region layer but also exhibiting increased operating temperature due to close lattice matching of face centered cubic monocrystalline layers forming the double heterojunctions, a monocrystalline buffer layer of a given conductivity-type lead salt semiconductor containing europium and selenium that has an energy band gap greater, an index of refraction lesser, and a lattice constant substantially equal to predetermined values, a monocrystalline active region layer on said buffer layer of a lead salt semiconductor containing a pn junction and having said predetermined energy band gap, index of refraction and lattice constant, and a confinement layer on said active region layer of a lead salt semiconductor of conductivity type opposite to said given conductivity type and containing a lesser amount of europium and selenium than said active region layer, wherein said confinement layer has an energy band gap greater, an index of regraction smaller, and a lattice constant substantially equal to said predetermined values.

3. In a double heterojunction semiconductor short wavelength infrared diode laser, the improvement wherein a lead telluride monocrystalline semiconductive active region layer of given energy band gap, index of refraction, and lattice constant is sandwiched between two lead-europium selenide-telluride monocrystalline semiconductor layers of mutucally opposite conductivity type and having an energy band gap significantly higher than, an index of refraction significantly lower than, and a lattice constant substantially equal to said lead telluride active layer, effective to increase laser performance by providing lattice matching among said layers as well as providing confinement for said active region layer.

4. In a double heterojunction semiconductor short wavelength infrared diode laser exhibiting current carrier and optical confinement for its active layer and close lattice matching of monocrystalline confinement and buffer layers contiguous its active region layer, a monocrystalline buffer layer of p-type conductivity lead-europium selenide-telluride semiconductor having about 1-15 mole percent europium and about 1-15 mole percent selenium, a monocrystalline active region layer on said buffer layer of a lead-europium selenide-telluride semiconductor containing less europium and selenium than the buffer layer and containing a pn junction for producing lasing action, and a confinement layer on said active region layer of an n-type lead-europium selenide-telluride semiconductor of substantially the same composition as in said buffer layer.

5. In a double heterojunction semiconductor long wavelength infrared diode laser, the improvement wherein a lead-tin telluride monocrystalline semiconductive active region layer of given energy band gap, index of refraction, and lattice constant is sandwiched between two lead-europium selenide-telluride monocrystalline semiconductor layers that may also contain tin, said lead-europium selenide-telluride monocrystalline semiconductor layers being of mutually opposite conductivity type and having an energy band gap significantly higher than, an index of refraction significantly lower than, and a lattice constant substantially equal to said lead-tin telluride active region layer, effective to increase laser performance by providing lattice matching among said layers as well as providing carrier and optical confinement to said active region layer.

6. In a large optical cavity quantum well infrared diode laser, where current carriers are confined in a quantum well active region and photons are confined in a large optical cavity, the improvement wherein layers forming the quantum well are closely lattice-matched to a supporting substrate, an active region and a covering contact layer, said active region having a lower energy band gap than its confinement layers and said confinement layers containing lead, europium, selenium and tellurium, with the europium and selenium each comprising about 1-15 mole percent and the europium concentration in said carrier confinement layers defining the quantum well being at least about 1 mole percent less than the europium concentration in photon confinement layers defining the large optical cavity, whereby the energy band gap of said carrier confinement layers is greater than the energy band gap of said active region and less than the energy band gap of said photon confinement layers.

* * * * *